United States Patent
Esaki

(10) Patent No.: US 11,440,157 B2
(45) Date of Patent: Sep. 13, 2022

(54) DUAL-SURFACE POLISHING DEVICE AND DUAL-SURFACE POLISHING METHOD

(71) Applicant: SUMCO CORPORATION, Tokyo (JP)

(72) Inventor: Keisuke Esaki, Saga (JP)

(73) Assignee: SUMCO CORPORATION, Tokyo (JP)

( * ) Notice: Subject to any disclaimer, the term of this patent is extended or adjusted under 35 U.S.C. 154(b) by 914 days.

(21) Appl. No.: 16/316,460

(22) PCT Filed: May 11, 2017

(86) PCT No.: PCT/JP2017/017855
§ 371 (c)(1),
(2) Date: Jan. 9, 2019

(87) PCT Pub. No.: WO2018/012097
PCT Pub. Date: Jan. 18, 2018

(65) Prior Publication Data
US 2019/0224807 A1   Jul. 25, 2019

(30) Foreign Application Priority Data
Jul. 13, 2016 (JP) .............................. JP2016-138464

(51) Int. Cl.
*B24B 37/08* (2012.01)
*B24B 37/28* (2012.01)
(Continued)

(52) U.S. Cl.
CPC ................ *B24B 37/08* (2013.01); *B24B 7/17* (2013.01); *B24B 37/005* (2013.01);
(Continued)

(58) Field of Classification Search
CPC ....... B24B 37/005; B24B 37/08; B24B 37/12; B24B 37/16; B24B 37/26; B24B 37/28;
(Continued)

(56) References Cited

U.S. PATENT DOCUMENTS 6,376,378 B1 * 4/2002 Chen ....................... B24B 37/20
                                                      438/692
7,156,726 B1 * 1/2007 Chen ..................... B24B 37/042
                                                      451/288
(Continued)

FOREIGN PATENT DOCUMENTS

JP   2000-317813 A       11/2000
JP   2006147731 A   *    6/2006
(Continued)

OTHER PUBLICATIONS

Office Action issued in Taiwanese family member Patent Appl. No. 106115743, dated Apr. 18, 2018, along with an English translation thereof.
(Continued)

*Primary Examiner* — Eileen P Morgan
(74) *Attorney, Agent, or Firm* — Greenblum & Bernstein, P.L.C.

(57) ABSTRACT

An inner-periphery-side cutoff part where a polishing surface of an upper plate inclines upward toward an inner periphery part of the upper plate and an inner-periphery-side cutoff part where a polishing surface of a lower plate inclines downward toward an inner periphery part of the lower plate are respectively formed on the respective inner periphery parts of the upper plate and the lower plate, or an outer-periphery-side cutoff part where the polishing surface of the upper plate inclines upward toward an outer periphery part of the upper plate and an outer-periphery-side cutoff part where the polishing surface of the lower plate inclines downward toward an outer periphery part of the lower plate are respectively formed on the respective outer periphery parts of the upper plate and the lower plate, or all of them are formed thereon.

4 Claims, 7 Drawing Sheets

(51) Int. Cl.
  B24B 7/17    (2006.01)
  B24B 37/16   (2012.01)
  B24B 37/26   (2012.01)
  B24B 37/12   (2012.01)
  H01L 21/304  (2006.01)
  B24B 37/04   (2012.01)
  B24B 37/005  (2012.01)

(52) U.S. Cl.
  CPC ............ B24B 37/042 (2013.01); B24B 37/12 (2013.01); B24B 37/16 (2013.01); B24B 37/26 (2013.01); B24B 37/28 (2013.01); H01L 21/304 (2013.01); H01L 21/3043 (2013.01)

(58) Field of Classification Search
  CPC .. B24B 7/17; B24B 7/228; B24B 5/01; B24B 37/042; H01L 21/3043
  USPC .................... 451/41, 57, 261, 262, 268, 269
  See application file for complete search history.

(56) References Cited

U.S. PATENT DOCUMENTS

| | | | | |
|---|---|---|---|---|
| 8,740,668 | B2* | 6/2014 | Duescher | B24B 37/107 451/63 |
| 8,992,288 | B2* | 3/2015 | Suzuki | B24B 37/22 451/285 |
| 9,327,382 | B2* | 5/2016 | Ueno | B24B 37/042 |
| 10,286,521 | B2* | 5/2019 | Hara | B24B 53/017 |
| 2003/0181141 | A1* | 9/2003 | Taniguchi | B24B 37/042 451/63 |
| 2004/0235402 | A1* | 11/2004 | Bjelopavlic | B24B 37/28 451/170 |
| 2008/0096474 | A1* | 4/2008 | Kato | B24B 9/065 451/37 |
| 2012/0270478 | A1* | 10/2012 | Duescher | B24B 37/245 451/288 |
| 2016/0332279 | A1* | 11/2016 | Yasuda | B24B 49/16 |
| 2017/0312878 | A1* | 11/2017 | Yasuda | B24B 49/10 |

FOREIGN PATENT DOCUMENTS

| | | |
|---|---|---|
| JP | 2016-138464 A | 8/2016 |
| JP | 2007-331036 A | 12/2017 |
| TW | 201707863 A | 3/2017 |
| WO | 2012/132073 A1 | 10/2012 |

OTHER PUBLICATIONS

Office Action issued in Chinese family member Patent Appl. No. 201780030616.5, dated Apr. 7, 2020, along with an English translation thereof.

Office Action issued in Korean family member Patent Appl. No. 10-2018-7035077, dated Nov. 6, 2019, along with an English translation thereof.

International Search Report issued in International Bureau of WIPO Patent Application No. PCT/JP2017/017855, dated Jun. 27, 2017, along with an English translation thereof.

* cited by examiner (a)

(b)

(c)

(POLISHING PRESSURE IS CONSTANT ON IN-PLANE)

(POLISHING PRESSURE IS LOWERED ON OUTER PERIPHERY PART AND INNER PERIPHERY PART)

DUAL-SURFACE POLISHING DEVICE AND DUAL-SURFACE POLISHING METHOD

TECHNICAL FIELD

The present invention relates to a dual-surface polishing device which simultaneously polishes front and back surfaces of wafers and a dual-surface polishing method using this device. More specifically, it relates to the dual-surface polishing device which is able to reduce a roll-off amount of wafer outer periphery part and thereby to improve flatness of the outer periphery part and a whole-surface shape of the wafers and the dual-surface polishing method using this device. Incidentally, the present international application claims the priority which is based on Japanese Patent Application No. 138464 filed on Jul. 13, 2016 (Japanese Patent Application No. 2016-138464) and quotes the whole contents of Japanese Patent Application No. 2016-138464 in the present international application.

BACKGROUND ART

In a manufacturing process of a semiconductor wafer such as, for example, a silicon wafer and so forth obtained by slicing a silicon single crystal, dual-surface polishing for simultaneously polishing the front and back surfaces of the wafer is generally adopted for the purpose of improving the flatness of the wafer.

In general, a dual-surface polishing device, which is equipped with an upper plate and a lower plate to polishing surfaces of which polishing cloths are stuck respectively and performs polishing of both surfaces of the wafers simultaneously by rotation while sandwichingly holding carriers which hold the wafers by this upper plate and the lower plate, is generally used for dual-surface polishing of the wafer. FIG. 7 is diagrams illustrating states where the shape of the wafer is changed with time when a polishing time passes in order of FIG. 7(a) to FIG. 7(e) in a general dual-surface polishing process. Incidentally, also a magnitude relation between a thickness of the wafer and a thickness of a carrier plate at respective time points in FIG. 7(a) to FIG. 7(e) is also illustrated in FIG. 7. In FIG. 7(a) to FIG. 7(e), the vertical axis indicates the thickness of the wafer and the horizontal axis indicates a position from the wafer center when a radius of the wafer is designated by R. That is, these drawings are the ones which illustrate states of a vertical-direction sectional shape of the wafer respectively in terms of thicknesses at respective positions from the wafer center and enlarged diagrams on the right are the ones in which one end of an outer periphery part (an edge part) of that wafer is enlarged.

As illustrated in FIG. 7, in dual-surface polishing, the front and back surfaces of the wafer are simultaneously polished with the polishing cloths which are stuck to the upper plate and the lower plate and the shape changes as illustrated in FIG. 7(a) to FIG. 7(e) as the polishing time passes. At an early stage of the polishing process illustrated in FIG. 7(a), a wafer whole-surface shape (a global shape) exhibits a protruded shape in which a thickness in the vicinity of the central-part is large and large sagging (roll-off) is observed on the wafer outer periphery part. In addition, at this early stage, the thickness of the wafer is sufficiently thicker than the thickness of the carrier plate. At the subsequent stage in FIG. 7(b), although the whole-surface shape of the wafer slightly approximates a flatter shape than the above-described protruded shape, the roll-off of the wafer outer periphery part which was observed at the early stage remains. When polishing further progresses and reaches a stage in FIG. 7(c), the thickness of the wafer and the thickness of the carrier plate become almost equal to each other and the whole-surface shape of the wafer exhibits an almost flat shape. In addition, since the polishing cloth is an elastic body and polishing is performed by applying a constant pressure thereto, in particular, at the stages in FIG. 7(a), FIG. 7(b), the polishing cloth sinks by a constant amount during polishing and therefore a larger stress is imposed on the wafer outer periphery part in comparison with that in the vicinity of the central part. On the other hand, when the thickness of the wafer and the thickness of the carrier plate become almost equal to each other, the stress which is imposed from the polishing cloth onto the wafer outer periphery part is dispersed to the carrier plate and the stress concerned is decreased. Therefore, at the stage in FIG. 7(c), an amount of the roll-off which is observed on the wafer outer periphery part is decreased.

Thereafter, when polishing progresses to a stage in FIG. 7(d), the vicinity of the wafer central part turns into a dented shape and the wafer outer periphery part turns into a raised shape. When polishing further progresses from this stage and reaches a stage in FIG. 7(e), the wafer central-part vicinity turns from the shape at the stage in FIG. 7(d) into a more dented shape and also a raising amount of the wafer outer periphery part is more increased. In addition, also the thickness of the wafer becomes further thinner relative to the thickness of the carrier plate.

From the above, it is general to perform polishing by controlling in such a manner that the thickness of the wafer becomes almost equal to the thickness of the carrier plate in order to obtain the wafers which are high in flatness and little in roll-off on the wafer outer periphery part and this control has been performed so far by adjustment of the polishing time and so forth.

However, it was difficult to accurately control polishing in control by the adjustment of the polishing time because of influences and so forth of a deviation in timing for stopping the device and a polishing environment. In addition, in association with recent microminiaturization of a microelectronics device structure, enlargement of a diameter of a semiconductor wafer and so forth, higher level control of the shape of the wafer which is manufactured, in particular, of the flatness, nano-topology and so forth is required. Therefore, various attempts for improvement are being examined also in the polishing device not limited to the improvement of the polishing process in order to obtain a wafer which is little in roll-off of the wafer outer periphery part and has favorable flatness and nano-topology.

No occurrence of shape deformation and so forth of plates during polishing, that is, rigidity of the plate is important in order to make a polishing pressure uniform. However, there was such a problem that the pressure which is imposed on a wafer surface from the polishing cloth becomes nonuniform on a wafer in-plane due to thermal deformation when polishing. In this case, a polish rate and a polishing amount also become nonuniform on the wafer in-plane and the wafers are not polished flat. For example, a dual-surface polishing device whose upper and lower plates are made to be processed into shapes of cancelling the deformation when polishing in a plate fabricating process by grasping in advance deformations of the upper and lower plates when polished is disclosed (for example, see Patent Literature 1) as the dual-surface polishing device which solves such a problem. In this dual-surface polishing device, the influence of the plate deformation during polishing is counteracted by fabricating the shapes of the upper and lower plates into shapes which allow for thermal deformations of the plates caused by a thermal environment during polishing and thereby making uniform the polishing pressure applied to the wafers under polishing, which improves the flatness thereof.

PRIOR ART LITERATURE

Patent Literature

Patent Literature 1: Japanese Unexamined Patent Application Publication No. 2002-166357 (claim 1, paragraph [0023], FIG. 3)

SUMMARY OF THE INVENTION

Problems to be Solved by the Invention

However, since circumferential speed at the plate outer periphery part is larger than at the plate in-plane relative to the wafer during polishing, a travelling amount of a wafer outer periphery part becomes large. Therefore, when controlling the polishing pressure of the plates in-plane to be constant, a problem was found that polishing of the wafer outer periphery part is accelerated. In the above-described conventional dual-surface polishing device indicated in Patent Literature 1, the deformation of the plates caused by the thermal environment and so forth is taken into consideration. However, differences and so forth in circumferential speed and travelling amount of the plate outer periphery part are not taken into consideration. Since the polishing pressure is simply controlled to be uniform in the dual-surface polishing device indicated in Patent Literature 1, polishing of the wafer outer periphery part progresses fast, the roll-off amount thereof becomes large and the flatness is worsened. Since roll-off, in particular, of the wafer outer periphery part cannot be sufficiently suppressed in this way by a conventional method, it is hard to perform polishing while simultaneously achieving the flatness of the wafer outer periphery part and the flatness of the whole-surface shape of the wafers and it was difficult to sufficiently cope with recent requirements.

An object of the present invention is to provide a dual-surface polishing device which is able to reduce the roll-off amount of the wafer outer periphery part and to improve the flatness of the outer periphery part and the whole-surface shape of the wafers.

Means for Solving the Problems

A first aspect of the present invention is characterized in that, in a dual-surface polishing device, which is equipped with an upper plate and a lower plate in the shape of a doughnut, each having a center hole in the central part thereof, and rotates the plates by a sun gear which is installed in the respective center holes in the upper plate and the lower plate and an internal gear which is installed on respective outer peripheral parts of the upper plate and the lower plate while sandwichingly holding carriers which hold wafers by the upper plate and lower plate and thereby simultaneously polishes both surfaces of the wafers, an inner-periphery-side cutoff part $X_1$ where a polishing surface of the upper plate inclines upward toward an inner periphery part of the upper plate and an inner-periphery-side cutoff part $Y_1$ where a polishing surface of the lower plate inclines downward toward an inner periphery part of the lower plate are respectively formed on the respective inner periphery parts of the upper plate and the lower plate, or an outer-periphery-side cutoff part $X_2$ where the polishing surface of the upper plate inclines upward toward the outer periphery part of the upper plate and an outer-periphery-side cutoff part $Y_2$ where the polishing surface of the lower plate inclines downward toward the outer periphery part of the lower plate are respectively formed on the respective outer periphery parts of the upper plate and the lower plate, or the inner-periphery-side cutoff parts $X_1$, $Y_1$ and the outer-periphery-side cutoff parts $X_2$, $Y_2$ are respectively formed on both of the respective outer periphery parts and the respective inner periphery parts of the upper plate and the lower plate, and the inner-periphery-side cutoff parts $X_1$, $Y_1$ and the outer-periphery-side cutoff parts $X_2$, $Y_2$ are respectively disposed in the form of a ring along the respective inner periphery parts or the respective outer periphery parts of the upper plate or the lower plate.

A second aspect of the present invention is the invention based on the first aspect and is characterized in that the cutoff parts are respectively provided further on both of the respective inner periphery parts and the respective outer periphery parts of the upper plate and lower plate.

A third aspect of the present invention is the invention based on the first or second aspect and is characterized by being controlled in such a manner that when vertical-direction cutoff amounts of the inner-periphery-side cutoff parts $X_1$, $Y_1$ are designated by $A_1$, $B_1$ (μm) respectively, $A_1$, $B_1$ (μm) satisfy a range of 10 μm≤$A_1$+$B_1$ 70≤μm and by being controlled in such a manner that when vertical-direction cutoff amounts of the outer-periphery-side cutoff parts $X_2$, $Y_2$ are designated by $A_2$, $B_2$ (μm) respectively, $A_2$, $B_2$ (μm) satisfy a range of 10 μm≤$A_2$+$B_2$≤70 μm.

A fourth aspect of the present invention is the invention based on the first to third aspects and is characterized by being controlled in such a manner that when a diameter of the wafer is designated by R (mm) and horizontal-direction widths of the inner-periphery-side cutoff parts $X_1$, $Y_1$ are designated by $C_1$, $D_1$ (mm) respectively, $C_1$, $D_1$ (mm) satisfy a range of 0.15×R (mm)≤($C_1$, $D_1$) 0.25×R(mm) and by being controlled in such a manner that when horizontal-direction widths of the outer-periphery-side cutoff parts $X_2$, $Y_2$ are designated by $C_2$, $D_2$ (mm) respectively, $C_2$, $D_2$ (mm) satisfy a range of 0.15×R (mm)≤($C_2$, $D_2$)≤0.25×R (mm).

A fifth aspect of the present invention is the invention based on the first to fourth aspects and is characterized in that respective inclined surfaces of the inner-periphery-side cutoff parts $X_1$, $Y_1$ and the outer-periphery-side cutoff parts $X_2$, $Y_2$ are linear inclined surfaces.

A sixth aspect of the present invention is a dual-surface polishing method of simultaneously polishing both surfaces of wafers by using the dual-surface polishing device of the first to fifth aspects.

Effect of the Invention

The dual-surface polishing device of the first aspect of the present invention a dual-surface polishing device, which is equipped with an upper plate and a lower plate in the shape of a doughnut, each having a center hole in the central part thereof, rotates the plates by the sun gear which is installed in the respective center holes in the upper plate and the lower plate and the internal gear which is installed on the respective outer peripheral parts of the upper plate and the lower plate while sandwichingly holding the carriers which hold the wafers by the upper plate and the lower plate and thereby simultaneously polishes the both surfaces of the wafers. Then, the inner-periphery-side cutoff part $X_1$ where the polishing surface of the upper plate inclines upward toward the inner periphery part of the upper plate and the inner-periphery-side cutoff part $Y_1$ where the polishing surface of the lower plate inclines downward toward the inner periphery part of the lower plate are respectively formed on the respective inner periphery parts of the upper plate and the lower plate, or the outer-periphery-side cutoff part $X_2$ where the polishing surface of the upper plate inclines upward toward the outer periphery part of the upper plate and the outer-periphery-side cutoff part $Y_2$ where the polishing surface of the lower plate inclines downward toward the outer periphery part of the lower plate are respectively formed on the respective outer periphery parts of the upper plate and the lower plate, or the inner-periphery-side cutoff parts $X_1$, $Y_1$ and the outer-periphery-side cutoff parts $X_2$, $Y_2$ are respectively formed on both of the respective outer periphery parts and the respective inner periphery parts of the upper plate and the lower plate, and the inner-periphery-side cutoff parts $X_1$, $Y_1$ and the outer-periphery-side cutoff parts $X_2$, $Y_2$ are respectively disposed in the form of a ring along the respective inner periphery parts or the respective outer periphery parts of the upper plate or the lower plate. Thereby, since the polishing pressure on the wafer outer periphery part is decreased in comparison with the polishing pressure in the vicinity of the wafer center part, the roll-off amount of the wafer outer periphery part can be lowered and the flatness of the outer periphery part and the whole-surface shape of the wafers can be improved.

In the dual-surface polishing device of the second aspect of the present invention, the inner-periphery-side cutoff parts $X_1$, $Y_1$ and the outer-periphery-side cutoff parts $X_2$, $Y_2$ are respectively provided on both of the respective inner periphery parts and the respective outer periphery parts of the upper plate and the lower plate. That is, since the cutoff parts are provided on all of the inner periphery parts and the outer periphery parts of the both plates, an effect of reducing the roll-off amount of the wafer outer periphery part is more heightened.

The dual-surface polishing device of the third aspect of the present invention is controlled in such a manner that when the vertical-direction cutoff amounts of the inner-periphery-side cutoff parts $X_1$, $Y_1$ are designated by $A_1$, $B_1$ (μm) respectively, $A_1$, $B_1$ (μm) satisfy the range of 10 μm≤$A_1$+$B_1$≤70 μm and is controlled in such a manner that when the vertical-direction cutoff amounts of the outer-periphery-side cutoff parts $X_2$, $Y_2$ are designated by $A_2$, $B_2$ (μm) respectively, $A_2$, $B_2$ (μm) satisfy the range of 10 μm≤$A_2$+$B_2$≤70 μm. Thereby, since the cutoff parts are controlled within a more appropriate range, the polishing pressure on the wafer outer periphery part is also reduced to a more appropriate pressure. Therefore, the effect of reducing the roll-off amount of the wafer outer periphery part is more heightened. Incidentally, $A_1$ and $B_1$ may be either the same value or different values. The same is true of $A_2$ and $B_2$.

In the device method of the fourth aspect of the present invention, it is controlled in such a manner that when the diameter of the wafer is designated by R (mm) and the horizontal-direction widths of the inner-periphery-side cutoff parts $X_1$, $Y_1$ are designated by $C_1$, $D_1$ (mm) respectively, $C_1$, $D_1$ (mm) satisfy the range of 0.15×R (mm)≤($C_1$, $D_1$)≤0.25×R(mm) and it is controlled in such a manner that when the horizontal-direction widths of the outer-periphery-side cutoff parts $X_2$, $Y_2$ are designated by $C_2$, $D_2$ (mm) respectively, $C_2$, $D_2$ (mm) satisfy the range of 0.15×R (mm)≤($C_2$, $D_2$)≤0.25×R (mm). The polishing pressure on the wafer outer periphery part can be reduced while controlling the horizontal-direction width of the wafer outer periphery part where roll-off is liable to occur within a more appropriate range by controlling the horizontal-direction widths of the cutoff parts within a predetermined range in this way. Thereby, the effect of reducing the roll-off amount of the wafer outer periphery part is more heightened. Incidentally, although $C_1$ and $D_1$ may be either the same value or different values, it is preferable that they are the same value or more approximate values. The same is true of $C_2$ and $D_2$.

In the method of the fifth aspect of the present invention, since the inclined surfaces of the cutoff parts which are provided on the upper plate and the respective cutoff parts which are provided on the lower plate are the linear inclined surfaces, machining of the plates is facilitated.

In the method of the sixth aspect of the present invention, since the both surfaces of the wafers are polished simultaneously by using the above-described dual-surface polishing device of the present invention, the flatness of the outer periphery part and the whole-surface shape of the wafers can be improved.

BRIEF DESCRIPTION OF DRAWINGS

FIG. 6(a) illustrates a conventional example in which a polishing pressure is, a constant polishing pressure is imposed on a wafer in-plane
and FIG. 6(b) illustrates the present embodiment in which the polishing pressure is lowered on a wafer outer periphery part.

EMBODIMENTS TO CARRY OUT THE INVENTION

Next, embodiments to carry out the present invention will be described on the basis of the drawings.

The present invention is improvement of a dual-surface polishing device, which is equipped with an upper plate and a lower plate in the shape of a doughnut, each having a center hole in the central part thereof and to polishing surfaces of which polishing cloths are stuck, rotates the plates by a sun gear which is installed in the respective center holes in the upper plate and the lower plate and an internal gear which is installed on respective outer peripheral parts of the upper plate and the lower plate while sandwichingly holding carriers which hold wafers by the upper plate and lower plate and thereby simultaneously polishes both surfaces of the wafers.

Figure 1:
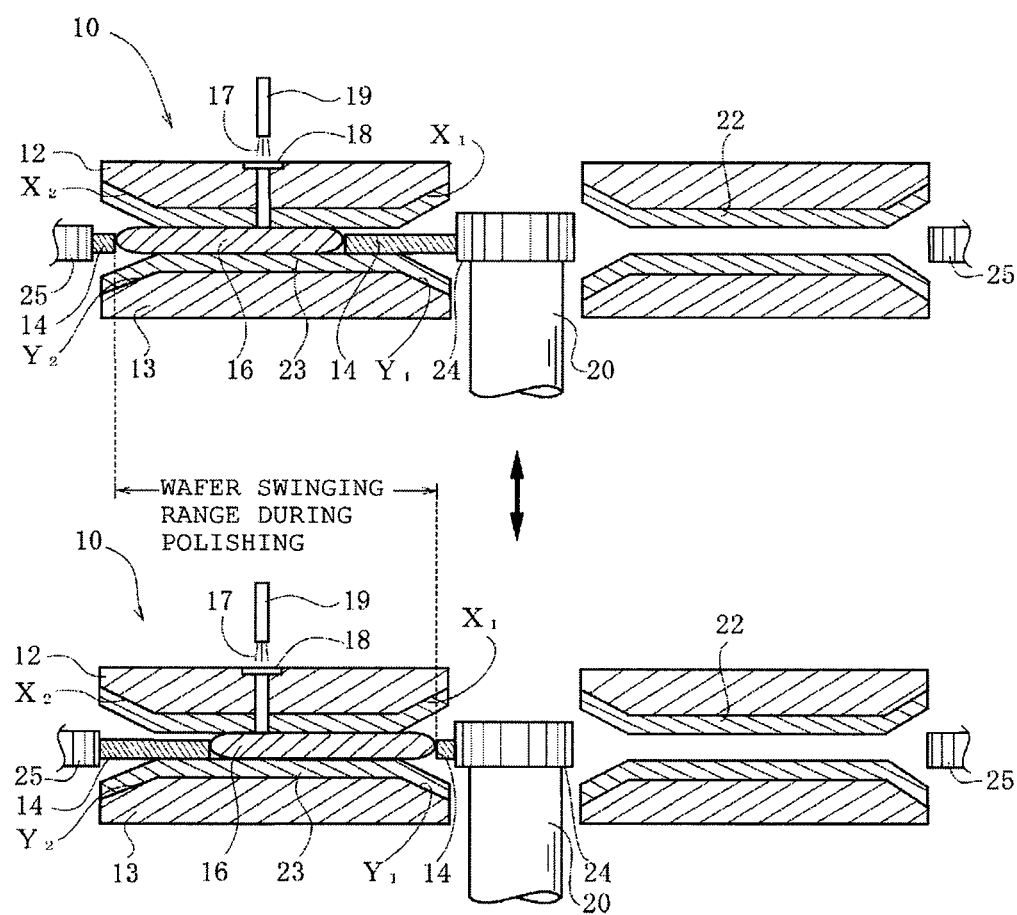
FIG. 1 Schematic sectional diagrams illustrating one example of a polishing device used in a method of an embodiment of the present invention.

There are no particular limitations on the dual-surface polishing device of the present invention except configurations of both of the upper and lower plates and the polishing cloths which are stuck thereto which will be described later and a general dual-surface polishing device may be used. For example, FIG. 1 is a schematic diagram illustrating one example of the dual-surface polishing device 10 used in an embodiment of the present invention and in this device 10, configurations are the same as those of the general dual-surface polishing device other than configurations of an upper plate 12, a lower plate 13. Incidentally, in FIG. 1 to FIG. 6, the same symbols denote the same components or members.

As illustrated in FIG. 1, the device 10 is equipped with two plates consisting of an upper plate 12 and a lower plate 13 in the shape of a doughnut each provided with a center hole in the central part thereof. Polishing cloths 22 and 23 are stuck to respective entire surfaces of the upper plate 12 and the lower plate 13. Incidentally, a sun gear 24 is provided between the respective center holes of the upper plate 12 and the lower plate 13 and an internal gear 25 is provided on respective peripheral edge parts thereof. An inner diameter of this internal gear 25 is larger than respective outer diameters of the upper plate 12 and the lower plate 13. Carrier plates 14 are installed on the lower plate 13 to which the polishing cloth 23 is stuck so as to be sandwiched by the upper plate 12 and the lower plate 13, and a wafer 16 which acts as a body to be polished is disposed in a holding hole in each of the carrier plate 14.

On the other hand, a slurry supply hole 18 through which slurry (a polishing solution) 17 will be supplied is provided in the upper plate 12, a supply pipe 19 is provided above the supply hole 18 and the slurry 17 which has been supplied from the supply pipe 19 is supplied to the wafer 16 through the supply hole 18. The upper plate 12 is installed so as to mutually face the lower plate 13 in such a manner that the polishing cloth 22 which is stuck to the upper plate 12 comes into contact with a front-side surface of the wafer 16 and the wafer 16 in the carrier plate 14 is sandwichingly held by the upper plate 12 and the lower plate 13 by pressurizing the upper plate 12.

Outer periphery teeth which engage with the sun gear 24 and the internal gear 25 are provided on an outer periphery part of the carrier plate 14. In addition, a shaft 20 is provided in the respective center holes in the upper plate 12 and the lower plate 13 and the carrier plate 14 revolves around the sun gear 24 while rotating as the upper plate 12 and the lower plate 13 are rotationally driven by a not illustrated power source. At this time, the wafer 16 moves as illustrated in FIG. 1 by rotation of the carrier plate 14.

Figure 2:
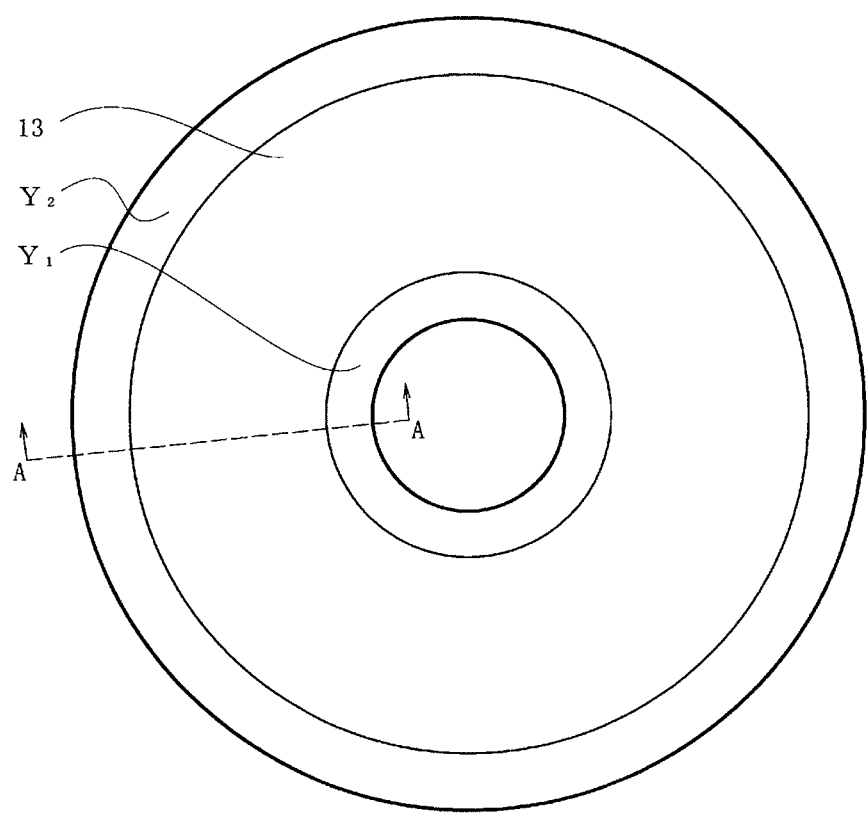
FIG. 2 A schematic diagram viewing a lower plate of the embodiment of the present invention from an upper surface.
Figure 3:
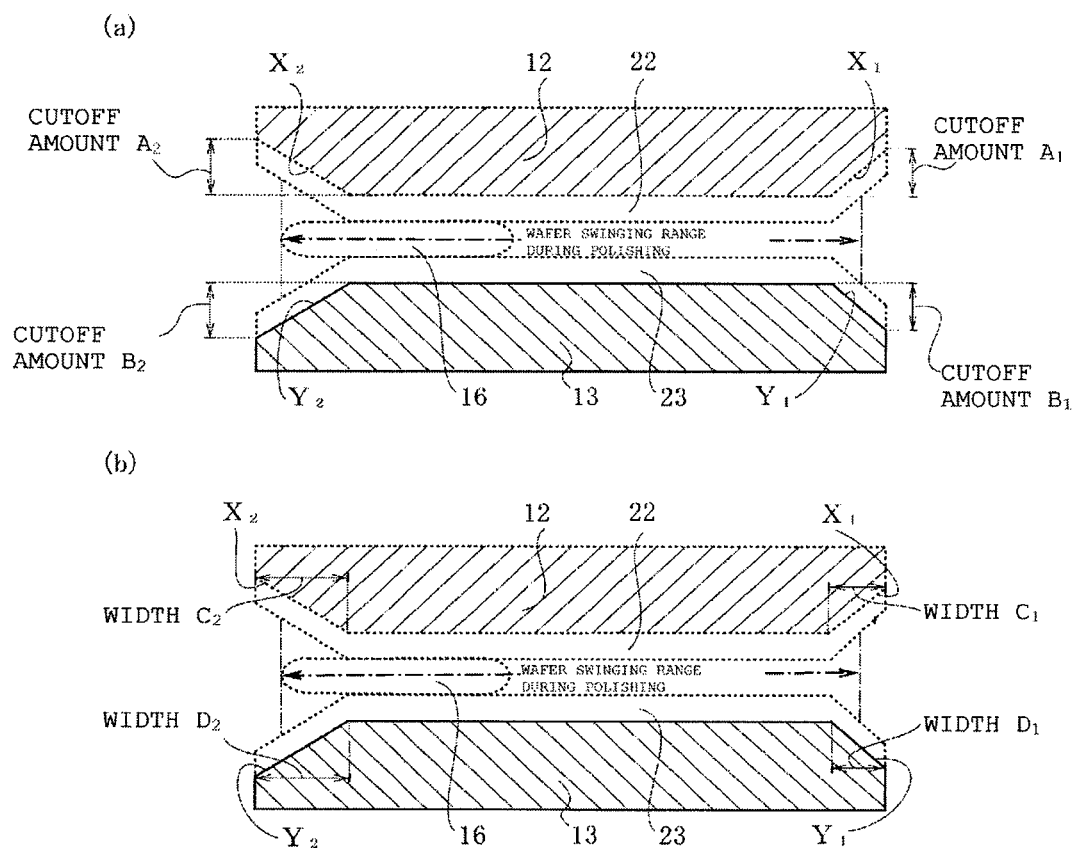
FIG. 3 Sectional diagrams along the A-A line in FIG. 2.

This embodiment is improvement of such a dual-surface polishing device and a characteristic configuration thereof lies in the point that as illustrated in FIG. 1 and FIG. 2, inner-periphery-side cutoff parts $X_1$, $Y_1$ and outer-periphery-side cutoff parts $X_2$, $Y_2$ are respectively formed on both of respective outer periphery parts and respective inner periphery parts of the upper plate 12 and the lower plate 13 and the inner-periphery-side cutoff parts $X_1$, $Y_1$ and the outer-periphery-side cutoff parts $X_2$, $Y_2$ are respectively provided in the form of a ring along the respective inner periphery parts or the respective outer periphery parts of the upper plate 12 or the lower plate 13. As another embodiment, the inner-periphery-side cutoff part $X_1$ where a polishing surface of the upper plate 12 inclines upward toward the inner periphery part of the upper plate 12 and the inner-periphery-side cutoff part $Y_1$ where a polishing surface of the lower plate 13 inclines downward toward the inner periphery part of the lower plate 13 may be formed simply on the respective inner periphery parts of the upper plate 12 and the lower plate 13 respectively. As another further embodiment, the outer-periphery-side cutoff part $X_2$ where the polishing surface of the upper plate 12 inclines upward toward the outer periphery part of the upper plate 12 and the outer-periphery-side cutoff part $Y_2$ where the polishing surface of the lower plate 13 inclines downward toward the outer periphery part of the lower plate may be formed simply on the respective outer periphery parts of the upper plate 12 and the lower plate 13 respectively. The above-described inner-periphery-side cutoff parts $X_1$, $Y_1$ and the above-described outer-periphery-side cutoff parts $X_2$, $Y_2$ are provided in the form of a ring along the respective inner periphery parts or the respective outer periphery parts of the upper plate 12 or the lower plate 13 respectively, and the cutoff parts $X_1$, $X_2$, $Y_1$, $Y_2$ are provided on the respective inner periphery parts or the respective outer periphery parts of the upper plate 12 and the lower plate 13.

As illustrated in FIG. 6(a), in a case where a polishing pressure is constant at a plate in-plane, a circumferential speed is larger relative to the wafer at the outer periphery part of the plate than at the plate in-plane (that is, a travelling amount is larger). Therefore, a roll-off amount of a wafer outer periphery part becomes large caused by acceleration of polishing of the outer periphery part of the wafer 16 and so forth. On the other hand, in the dual-surface polishing device 10 of the present invention, as illustrated in FIG. 6(b), the cutoff parts $X_1$, $X_2$, $Y_1$, $Y_2$ are provided on the respective inner periphery parts or the respective outer periphery parts of the upper plate 12 and the lower plate 13. Thereby, since the polishing pressures of the respective inner periphery parts or the respective outer periphery parts of the upper plate 12, the lower plate 13 are lowered in comparison with the polishing pressure of the plate in-plane, polishing of the outer periphery part of the wafer 16 is slightly suppressed, the roll-off amount of the wafer outer periphery part is lowered in a part surrounded with a dashed line in FIG. 6(b) and thereby flatness of the outer periphery part and the whole-surface shape of the wafer 16 can be improved. In FIGS. 6(a) and (b), a length of a directional line indicates the magnitude of the polishing pressure. It is preferable to form all the inner-periphery-side cutoff parts $X_1$, $Y_1$ and the outer-periphery-side cutoff parts $X_2$, $Y_2$ as in this embodiment. In general, GBIR which will be described later is often used as an index which indicates the flatness of the whole-surface shape of the wafer 16 and ESFQR which will be described later is often used as an index which indicates the flatness of the outer periphery part of the wafer 16. That is, in a dual-surface polishing method of the present invention, these GBIR and ESFQR can be simultaneously achieved on the wafer 16 after polished.

Here, as illustrated in FIG. 3(a), it is preferable to be controlled in such a manner that when vertical-direction cutoff amounts of the inner-periphery-side cutoff parts $X_1$, $Y_1$ are designated by $A_1$, $B_1$ (μm) respectively, $A_1$, $B_1$ (μm) satisfy a range of 10 μm≤$A_1$+$B_1$≤70 μm and to be controlled in such a manner that when vertical-direction cutoff amounts of the outer-periphery-side cutoff parts $X_2$, $Y_2$ are designated by $A_2$, $B_2$ (μm) respectively, $A_2$, $B_2$ (μm) satisfy a range of 10 μm≤$A_2$+$B_2$≤70 μm. When $A_1$+$B_1$ or $A_2$+$B_2$ is less than 10 μm which is a lower limit value, it is hard to sufficiently obtain the effect of reducing the polishing pressure on the outer periphery part of the wafer 16. On the other hand, when exceeding 70 μm which is an upper limit value, a part where the polishing cloth is in contact with the wafer is reduced and the flatness cannot be sufficiently improved.

Among them, it is particularly preferable to control in such a manner that $A_1$, $B_1$ (μm) satisfy a range of 30 μm≤$A_1$+$B_1$≤50 μm and $A_2$, $B_2$ (μm) satisfy a range of 30 μm≤$A_2$+$B_2$≤50 μm. In addition, since processing is performed while sandwichingly holding the wafers by the upper and lower plates in a dual-surface polishing device, the above-described ranges may be satisfied by $A_1$+$B_1$ and $A_2$+$B_2$, and $A_1$ and $B_1$, and $A_2$ and $B_2$ may not be particularly set to the same value.

In addition, as illustrated in FIG. 3(b), it is preferable to be controlled in such a manner that when a diameter of the wafer 16 is designated by R (mm) and horizontal-direction widths of the inner-periphery-side cutoff parts $X_1$, $Y_1$ are designated by $C_1$, $D_1$ (mm) respectively, $C_1$, $D_1$ (mm) satisfy a range of 0.15×R (mm)≤($C_1$, $D_1$)≤0.25×R(mm) and to be controlled in such a manner that when horizontal-direction widths of the outer-periphery-side cutoff parts $X_2$, $Y_2$ are designated by $C_2$, $D_2$ (mm) respectively, $C_2$, $D_2$ (mm) satisfy a range of 0.15×R (mm)≤($C_2$, $D_2$)≤0.25×R (mm). This is because when $C_1$, $D_1$, $C_2$, $D_2$ are less than a lower limit value, there are cases where boundaries between flat parts and the cutoff parts of the upper and lower plats become discontinuous. On the other hand, when exceeding an upper limit value, a region where the polishing pressure is lowered reaches a part other than the outer periphery part of the wafer 16. Therefore, there are cases where the flatness of the whole-surface shape of the wafer 16 is impaired and GBIR is worsened. Among them, it is particularly preferable to be controlled in such a manner that $C_1$, $D_1$ (mm) satisfy a range of 0.15×R (mm)≤($C_1$, $D_1$)≤0.20×R(mm) and $C_2$, $D_2$ (mm) satisfy a range of 0.15×R (mm)≤($C_2$, $D_2$)≤0.20×R (mm). Incidentally, it is more preferable that $C_1$ and $D_1$ be the same value or more approximate values, because the polishing pressures by the upper and lower plates can be transmitted uniformly to the outer periphery part of the wafer 16. The same is also true of $C_2$ and $D_2$.

Figure 4:
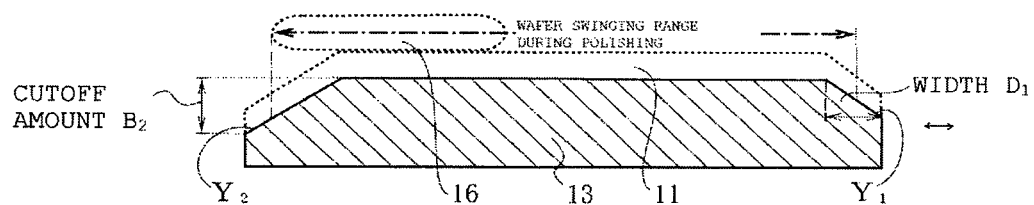
FIG. 4 An explanatory diagram in a case where a wafer does not reach the innermost outer periphery part of a polishing cloth during polishing.
Figure 5:
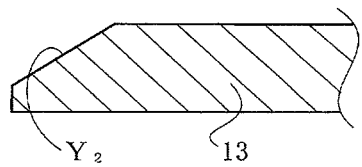
FIG. 5 Schematic diagrams illustrating examples of a sectional shape of an inclined surface of a cutoff part.
Figure 5:
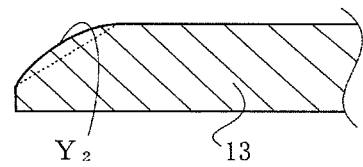
Figure 5:
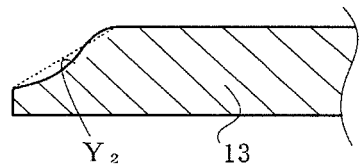
Figure 6:
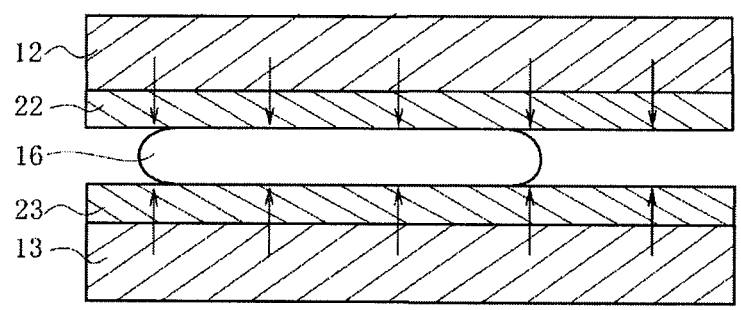
FIGS. 6(a) and 6(b) Explanatory diagrams illustrating that an influence due to a difference in circumferential speed of an outer periphery part is reduced in comparison with that by a conventional method.
Figure 6:
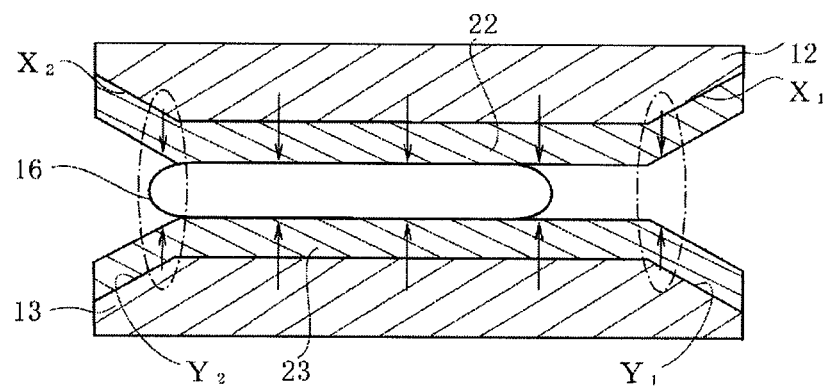
Figure 7:
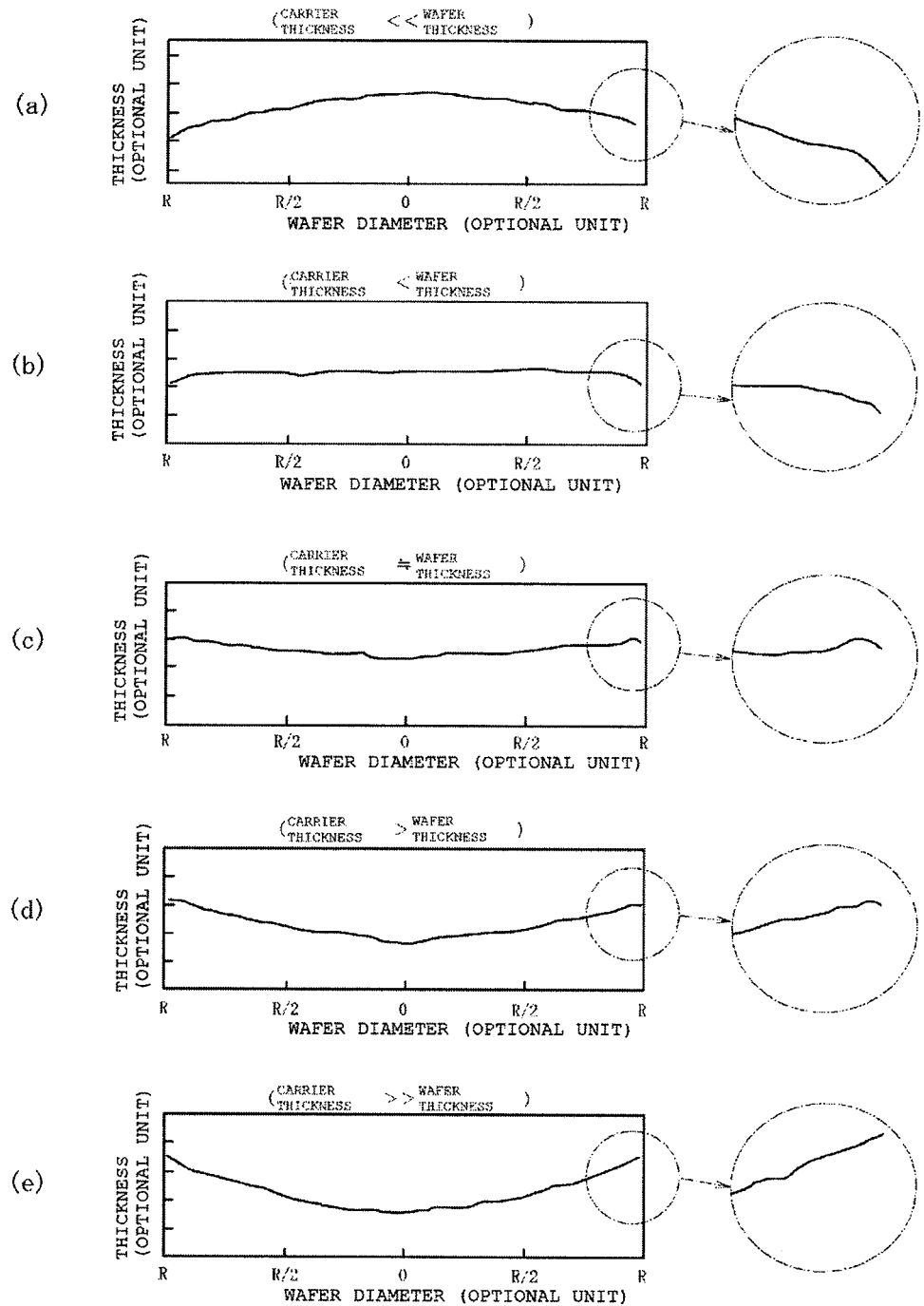
FIG. 7 Diagrams illustrating a state where a wafer shape changes with the passage of a polishing time in a general dual-surface polishing process.

Incidentally, as illustrated in FIG. 4, in a case where the wafer 16 does not travel to the innermost outer periphery parts of the polishing cloths 22, 23 during polishing, the vertical-direction cutoff amount $B_2$, the horizontal-direction width $D_1$ are measured with the most outer-periphery-side point and the most inner-periphery-side point of a polishing cloth 11 where the wafer 16 reaches during polishing being set as starting points respectively. Although not illustrated, the same is true of all the cutoff parts.

In addition, the inclined surfaces of the inner-periphery-side cutoff parts $X_1$, $Y_1$ and the outer-periphery-side cutoff parts $X_2$, $Y_2$ may be configured by inclined surfaces and so forth including a curved surface as illustrated in FIG. 5(b), FIG. 5(c) in addition to a linear inclined surface such as that as illustrated in FIG. 5(a). Among them, it is preferable to be the linear inclined surface such as that as illustrated in FIG. 5(a) for easiness in processing onto the plates.

As a method of forming the inner-periphery-side cutoff parts $X_1$, $Y_1$ and the outer-periphery-side cutoff parts $X_2$, $Y_2$ on the upper plate 12, the lower plate 13, for example, a method of grinding the respective inner periphery parts or the respective outer periphery parts of the upper plate 12, the lower plate 13 which are provided on the general polishing device by using a grinding stone and so forth is given.

As described above, if the dual-surface polishing device of the present invention is used, the roll-off amount of the wafer outer periphery part can be decreased and the flatness of the outer periphery part and the whole-surface shape of the wafers can be improved. Incidentally, in the dual-surface polishing method using the above-described dual-surface polishing device of the present invention, there are no particular limitations on a specific procedure and other conditions when performing polishing other than the above-described configurations of the plates and it can be performed under well-known conditions.

EXAMPLES

Next, examples of the present invention will be described in detail together with comparative examples.

Example 1

Dual-surface polishing of wafers was performed by using the dual-surface polishing device 10 illustrated in FIG. 1 and by changing conditions of the vertical-direction cutoff amounts $A_1$, $B_1$ of the inner-periphery-side cutoff parts $X_1$, $Y_1$, the vertical-direction cutoff amounts $A_2$, $B_2$ of the outer-periphery-side cutoff parts $X_2$, $Y_2$, the horizontal-direction widths $C_1$, $D_1$ of the inner-periphery-side cutoff parts $X_1$, $Y_1$, the horizontal-direction widths $C_2$, $D_2$ of the outer-periphery-side cutoff parts $X_2$, $Y_2$ for every test example as in the following Table 1. Here, silicon wafers which are 300 mm in diameter were used as the wafers. In the respective test examples, $A_1$=$A_2$=$B_1$=$B_2$. Here, the horizontal-direction widths $C_1$, $D_1$ of the inner-periphery-side cutoff parts $X_1$, $Y_1$, the horizontal-direction widths $C_2$, $D_2$ of the outer-periphery-side cutoff parts $X_2$, $Y_2$ were all set to 51 mm. In addition, the cutoff parts were formed by grinding the respective inner periphery parts and the respective outer periphery parts of the upper plate and the lower plate by a grinding machine.

Incidentally, in a test example 1, dual-surface polishing of the wafers was performed without forming the cutoff parts.

Specifically, the dual-surface polishing was performed by using a polishing solution (manufactured by Nitta Haas Incorporated, the product name: nalco2350), a polishing cloth (manufactured by Nitta Haas Incorporated, the product name: suba800), a wafer (a diameter R: 300 mm, a thickness: 790 mm), a carrier (a thickness: 778 mm), under conditions of a plate rotation number: 20 to 30 rpm, a pressure-machined surface: 300 g/cm², a target thickness: 780 mm.

<Evaluation>

(i) GBIR: The flatness of the wafer whole-surface after dual-surface-polishing was evaluated by measuring GBIR using a measurement device (manufactured by KLA Tencor Corporation, the type name: Wafer Sight2). As a measurement condition at that time, a measurement range was set to 296 mm with the exclusion of 2 mm of the outer periphery part of the wafer. GBIR (Global Backside Ideal Range) is a value which is used as an index which indicates the flatness of the whole-surface shape of the wafer. This GBIR is obtained by calculating a difference between a maximum thickness and a minimum thickness of the entire wafer with a back surface of the wafer in a case of supposing that the back surface of the wafer has been perfectly adhered by suction being set as a reference.

(ii) ESFQRmax: The flatness of the wafer outer periphery part after dual-surface-polished was evaluated by measuring ESFQRmax using the above-described measurement device (manufactured by KLA Tencor Corporation, the type name: Wafer Sight2). ESFQRmax is the one which indicates a maximum value in the ESFQRs of all sectors (a plurality of fan-shaped regions formed on the wafer outer periphery part) and ESFQR (Edge flatness metric. Sector based, Front surface referenced, Site Front least sQuares Range) is the one that SFQR in the sector was measured. A measurement condition of ESFQRmax is that a region of the wafer outer periphery part of 30 mm except the region of the outermost periphery part of 2 mm was measured by dividing it into 72 fan-shaped sectors.

TABLE 1

| Wafer | Outer-Periphery-Side | Inner-Periphery-Side | Evaluation | |
|---|---|---|---|---|
| Diameter (R) [mm] | Cutoff Part $A_2 + B_2$ [μm] | Cutoff Part $A_1 + B_1$ [μm] | GBIR (Mean Value) [μm] | ESFQRmax (Mean Value) [μm] |
| Test Example 1 | 300 | 0 | 0 | 221 | 37 |
| Test Example 2 | 300 | 10 | 10 | 158 | 30 |
| Test Example 3 | 300 | 20 | 20 | 144 | 29 |
| Test Example 4 | 300 | 30 | 30 | 122 | 23 |
| Test Example 5 | 300 | 40 | 40 | 118 | 22 |
| Test Example 6 | 300 | 50 | 50 | 111 | 20 |
| Test Example 7 | 300 | 60 | 60 | 143 | 29 |
| Test Example 8 | 300 | 70 | 70 | 200 | 35 |
| Test Example 9 | 300 | 80 | 80 | 236 | 41 |

As apparent from Table 1, in comparison with the test example 1 in which the cutoff part is not formed, in the test examples 2 to 8 in which these are formed, GBIR, ESFQRmax indicate low values and it can be seen that excellent flatness was obtained on both of the wafer outer periphery part and the whole-surface shape. On the other hand, in the test example 9 in which the cutoff amount exceeded 70 μm, it can be seen that GBIR, ESFQRmax are more worsened than those of the test example 1.

In addition, it was confirmed that the effect of improving the flatness is obtained from 10 μm in cutoff amount and the flatness becomes favorable in association with an increase in cutoff amount up to 50 μm. On the other hand, when the cutoff amount exceeds 50 μm, a tendency that the flatness is slightly worsened was observed. It is thought that this is because when the cutoff amount is increased, contact between the polishing cloths stuck to the upper plate and the lower plate and the wafer becomes weak and it has led to worsening of the flatness. Judging from results of numerical values of the test examples 2 to 8, it is thought that a range up to 70 μm is favorable for obtaining the effect of improving the flatness.

Example 2

Dual-surface polishing of wafers was performed by using the dual-surface polishing device 10 illustrated in FIG. 1 and changing the conditions of the horizontal-direction widths $C_1$, $D_1$ of the inner-periphery-side cutoff parts $X_1$, $Y_1$, the horizontal-direction widths $C_2$, $D_2$ of the outer-periphery-side cutoff parts $X_2$, $Y_2$ for every test example as indicated in the following Table 2. Here, silicon wafers which are 300 mm in diameter were used as the wafers. In addition, a coefficient α indicated in Table 2 is the coefficient α when the cutoff parts were respectively expressed in terms of lengths relative to the wafer diameter R, that is, as $C_1$, $C_2$, $D_1$, $D_2 = \alpha \times R$. In addition, in each example at this time, $C_1 = C_2 = D_1 = D_2$. In addition, the vertical-direction cutoff amounts $A_1$, $B_1$ of the inner-periphery-side cutoff parts $X_1$, $Y_1$ and the vertical-direction cutoff amounts $A_2$, $B_2$ of the outer-periphery-side cutoff parts $X_2$, $Y_2$ were all fixed to 50 μm which was decided as an optimum value in the example 1. Other performance conditions and evaluation conditions are the same as those in the example 1. Incidentally, a test example 10 and a test example 14 indicated in Table 2 are the test examples which are the same as the test example 1, the test example 6 indicated in the above-described Table 1 respectively.

TABLE 2

| Wafer | Outer-Periphery-Side Cutoff Part $C_2$, $D_2$ | | Inner-Periphery-Side Cutoff Part $C_1$, $D_2$ | | Evaluation | |
|---|---|---|---|---|---|---|
| Diameter (R) [mm] | Coefficient α | Width [mm] | Coefficient A | Width [mm] | GBIR (Mean Value) [nm] | ESFQR max (Mean Value) [nm] |
| Test Example 10 | 300 | 0 | 0 | 0 | 0 | 221 | 37 |
| Test Example 11 | 300 | 0.10 | 30 | 0.10 | 30 | 180 | 41 |
| Test Example 12 | 300 | 0.15 | 45 | 0.15 | 45 | 122 | 26 |
| Test Example 13 | 300 | 0.17 | 51 | 0.17 | 51 | 111 | 20 |
| Test Example 14 | 300 | 0.20 | 60 | 0.20 | 60 | 134 | 22 |
| Test Example 15 | 300 | 0.25 | 75 | 0.25 | 75 | 143 | 25 |
| Test Example 16 | 300 | 0.30 | 90 | 0.30 | 90 | 232 | 29 |

As apparent from Table 2, it can be seen that improvement is observed in GBIR in the test examples 11 to 15 in comparison with the test example 10 in which the cutoff part is not formed. In addition, ESFQRmax indicates low values in the test examples 12 to 16. From this result, it can be said that the excellent flatness was obtained on both of the outer periphery parts and the whole-surface shapes of the wafers, in particular, in the test examples 12 to 15.

INDUSTRIAL APPLICABILITY

The present invention can be utilized for dual-surface polishing of the wafers for obtaining the flatness of the wafers, for example, in a manufacturing process of semiconductor wafers which are represented by the silicon wafers.

The invention claimed is:

1. A dual-surface polishing device comprising:
an upper plate and a lower plate in the shape of a doughnut, each having a center hole in the central part thereof, rotates the plates by a sun gear which is installed in the respective center holes in the upper plate and the lower plate and an internal gear which is installed on respective outer peripheral parts of the upper plate and the lower plate while sandwichingly holding carriers which hold a wafer by the upper plate and the lower plate and thereby simultaneously polishes both surfaces of the wafers,
wherein:
an inner-periphery-side cutoff part $X_1$ where a polishing surface of the upper plate inclines upward toward an inner periphery part of the upper plate and an inner-periphery-side cutoff part $Y_1$ where a polishing surface of the lower plate inclines downward toward an inner periphery part of the lower plate are respectively formed on the respective inner periphery parts of the upper plate and the lower plate, and an outer-periphery-side cutoff part $X_2$ where the polishing surface of the upper plate inclines upward toward the outer periphery part of the upper plate and an outer-periphery-side cutoff part $Y_2$ where the polishing surface of the lower plate inclines downward toward the outer periphery part of the lower plate are respectively formed on the respective outer periphery parts of the upper plate and the lower plate,
the inner-periphery-side cutoff parts $X_1$, $Y_1$ and the outer-periphery-side cutoff parts $X_2$, $Y_2$ are respectively disposed in the form of a ring along the respective inner periphery parts and the respective outer periphery parts of the upper plate or the lower plate,
the dual-surface polishing device is controlled in such a manner that when vertical-direction cutoff amounts of the inner-periphery-side cutoff parts $X_1$, $Y_1$ are designated by $A_1$, $B_1$ (μm) respectively, the $A_1$, $B_1$ (μm) satisfy a range of 10 μm≤$A_1$+$B_1$≤70 μm, and
the dual-surface polishing device is controlled in such a manner that when vertical-direction cutoff amounts of the outer-periphery-side cutoff parts $X_2$, $Y_2$ are designated by $A_2$, $B_2$ (μm) respectively, the $A_2$, $B_2$ (μm) satisfy a range of 10 μm≤$A_2$+$B_2$≤70 μm.

2. The dual-surface polishing device according to claim 1, wherein:
the dual-surface polishing device is controlled in such a manner that when a diameter of the wafer is designated by R (mm) and horizontal-direction widths of the inner-periphery-side cutoff parts $X_1$, $Y_1$ are designated by $C_1$, $D_1$ (mm) respectively, the $C_1$, $D_1$ (mm) satisfy a range of 0.15×R≤($C_1$, $D_1$)≤0.25×R, and
the dual-surface polishing device is controlled in such a manner that when horizontal-direction widths of the outer-periphery-side cutoff parts $X_2$, $Y_2$ are designated by $C_2$, $D_2$ (mm) respectively, the $C_2$, $D_2$ (mm) satisfy a range of 0.15×R (mm)≤($C_2$, $D_2$)≤0.25×R (mm).

3. The dual-surface polishing device according to claim 1, wherein
respective inclined surfaces of the inner-periphery-side cutoff parts $X_1$, $Y_1$ and the outer-periphery-side cutoff parts $X_2$, $Y_2$ are linear inclined surfaces.

4. A dual-surface polishing method of simultaneously polishing both surfaces of wafers by using the dual-surface polishing device according to claim 1.

* * * * *